(12) United States Patent
Shibusawa (10) Patent No.: US 7,482,187 B2
(45) Date of Patent: Jan. 27, 2009

(54) DISPLAY AND METHOD OF MANUFACTURING THE SAME

(75) Inventor: Makoto Shibusawa, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 267 days.

(21) Appl. No.: 11/555,302

(22) Filed: Nov. 1, 2006

(65) Prior Publication Data

US 2007/0075944 A1    Apr. 5, 2007

Related U.S. Application Data

(63) Continuation of application No. PCT/JP2005/023197, filed on Dec. 13, 2005.

(30) Foreign Application Priority Data

Feb. 28, 2005    (JP) .............................. 2005-053424

(51) Int. Cl.
H01L 21/00    (2006.01)
(52) U.S. Cl. ...................................................... 438/29
(58) Field of Classification Search ............. 438/22–30, 438/142–166
See application file for complete search history.

(56) References Cited

U.S. PATENT DOCUMENTS

| | | | |
|---|---|---|---|
| 6,373,454 B1 | 4/2002 | Knapp et al. | |
| 7,224,032 B2 * | 5/2007 | Shiraki et al. | 257/347 |
| 2003/0148566 A1 * | 8/2003 | Noguchi et al. | 438/200 |
| 2003/0214248 A1 | 11/2003 | Jinno | |
| 2004/0229387 A1 | 11/2004 | Jinno | |
| 2005/0041002 A1 * | 2/2005 | Takahara et al. | 345/76 |
| 2005/0168490 A1 | 8/2005 | Takahara | |
| 2005/0168491 A1 | 8/2005 | Takahara | |
| 2005/0180083 A1 | 8/2005 | Takahara | |
| 2006/0060853 A1 | 3/2006 | Shibusawa | |
| 2006/0138420 A1 | 6/2006 | Shibusawa | |
| 2006/0139260 A1 | 6/2006 | Shibusawa | |
| 2006/0202920 A1 | 9/2006 | Shibusawa | |
| 2006/0222100 A1 | 10/2006 | Omata et al. | |
| 2007/0075944 A1 | 4/2007 | Shibusawa | |

FOREIGN PATENT DOCUMENTS

| | | |
|---|---|---|
| JP | 2003/216100 A | 7/2003 |
| JP | 2004/006339 A | 1/2004 |
| JP | 2004-029755 A | 1/2004 |
| JP | 2004/342457 A | 12/2004 |
| WO | WO 03/091978 A1 | 11/2003 |

OTHER PUBLICATIONS

U.S. Appl. No. 11/658,044, filed Jan. 22, 2007, Shibusawa.

* cited by examiner

*Primary Examiner*—Savitri Mulpuri
(74) *Attorney, Agent, or Firm*—Oblon, Spivak, McClelland, Maier & Neustadt, P.C.

(57) ABSTRACT

A method of manufacturing a display includes selecting at least one of pixels which can be seen as a luminous line or a luminous dot with a dark line-like tail when an inspection image is displayed, and breaking a first conductive path connecting a display element to a power supply terminal and a second conductive path connecting the first conductive path to a video signal line in the selected pixel.

5 Claims, 7 Drawing Sheets

DISPLAY AND METHOD OF MANUFACTURING THE SAME

CROSS-REFERENCE TO RELATED APPLICATIONS

This is a Continuation Application of PCT Application No. PCT/JP2005/023197, filed Dec. 13, 2005, which was published under PCT Article 21 (2) in Japanese.

This application is based upon and claims the benefit of priority from prior Japanese Patent Application No. 2005-053424, filed Feb. 28, 2005, the entire contents of which are incorporated herein by reference.

BACKGROUND OF THE INVENTION

1. Field of the Invention

The present invention relates to a display and a method of manufacturing the same and, more particularly, to an active matrix display and a method of manufacturing the same.

2. Description of the Related Art

In an organic electroluminescent (EL) display, image quality deterioration such as luminance unevenness occurs if a drive current varies.

Therefore, when an active matrix driving method is used in this display, the characteristics of a drive control element for controlling the magnitude of the drive current must be substantially the same between pixels. In this display, however, the drive control element is normally formed on an insulator such as a glass substrate, so the characteristics of the element easily vary.

U.S. Pat. No. 6,373,454 describes an organic EL display using a current mirror circuit in a pixel. This pixel includes an n-channel field-effect transistor (FET) as the drive control element, an organic EL element, a capacitor, an output control switch, a video signal supply control switch, and a diode-connecting switch.

The source of the drive control element is connected to a first power supply line at a low electric potential, and the capacitor is connected between the gate of the drive control element and the first power supply line. The output control switch is connected between the drain of the drive control element and the cathode of the organic EL element, and the anode of the organic EL element is connected to a second power supply line at a higher electric potential. The video signal supply control switch is connected between the drain of the drive control element and a video signal line, and the diode-connecting switch is connected between the drain and gate of the drive control element.

During a write period, the pixel including the current mirror circuit is supplied with a current signal $I_{sig}$ as a video signal. During a hold period following the write period, a drive current having a magnitude substantially equal to that of the electric current $I_{sig}$ flows between the drain and source of the drive control element. This makes it possible to eliminate the influence of not only a threshold value $V_{th}$ but also the mobility, dimensions, and the like of the drive control element on the drive current.

In an active matrix display, some pixels are sometimes viewed as luminous dots or dark dots owing to disconnections or short circuits in the pixel circuit. Also, in an active matrix display, pixel columns or rows are sometimes viewed as luminous lines or dark lines owing to disconnections of scan signal lines or video signal lines.

When achieving the present invention, the present inventor has found that in an active matrix display in which a current signal is written as a video signal in a pixel circuit, a luminous dot with a luminous or dark line-like tail forms in an image in addition to the line- or dot-like luminance unevenness described above.

BRIEF SUMMARY OF THE INVENTION

It is an object of the present invention to prevent the formation of a luminous dot with a luminous or dark line-like tail in an image on an active matrix display in which a current signal is written as a video signal in a pixel circuit.

According to a first aspect of the present invention, there is provided a display comprising an insulating substrate, pixels arranged in a matrix form on the insulating substrate, and video signal lines arranged correspondently with columns which the pixels form, wherein each of the pixels comprises a drive control element which includes a control terminal, a first terminal connected to a first power supply terminal, and a second terminal outputting a current with a magnitude corresponding to a voltage between the control terminal and the first terminal, a display element which includes a first electrode, a second electrode connected to a second power supply terminal, and an active layer interposed between the first and second electrodes, an output control switch which is connected between the second terminal and the first electrode, a switch group which switches an electrical connection between first and second states, the first state being a state that the second terminal, the video signal line, and the control terminal are electrically connected to one another, and the second state being a state that the second terminal, the video signal line, and the control terminal are electrically disconnected from one another, and a capacitor which is connected to the control terminal, wherein a first conductive path electrically connecting the first electrode to the first power supply terminal and a second conductive path electrically connecting the second terminal to the video signal line are broken in a part of the pixels.

According to a second aspect of the present invention, there is provided a method of manufacturing a display comprising an insulating substrate, pixels arranged in a matrix form on the insulating substrate, and video signal lines arranged correspondently with columns which the pixels form, wherein each of the pixels comprises a drive control element which includes a control terminal, a first terminal connected to a first power supply terminal, and a second terminal outputting a current with a magnitude corresponding to a voltage between the control terminal and the first terminal, a display element which includes a first electrode, a second electrode connected to a second power supply terminal, and an active layer interposed between the first and second electrodes, an output control switch which is connected between the second terminal and the first electrode, a switch group which switches an electrical connection between first and second states, the first state being a state that the second terminal, the video signal line, and the control terminal are electrically connected to one another, and the second state being a state that the second terminal, the video signal line, and the control terminal are electrically disconnected from one another, and a capacitor which is connected to the control terminal, comprising selecting at least one of the pixels which can be seen as a luminous line or a luminous dot with a dark line-like tail when an inspection image is displayed, and breaking a first conductive path electrically connecting the first electrode to the first power supply terminal and a second conductive path electrically connecting the second terminal to the video signal line in the selected pixel.

DETAILED DESCRIPTION OF THE INVENTION

Embodiments of the present invention will be described in detail below with reference to the accompanying drawings. Note that the same reference numerals in the drawings denote constituent elements which achieve the same or similar functions, and a repetitive explanation thereof will be omitted.

Figure 1:
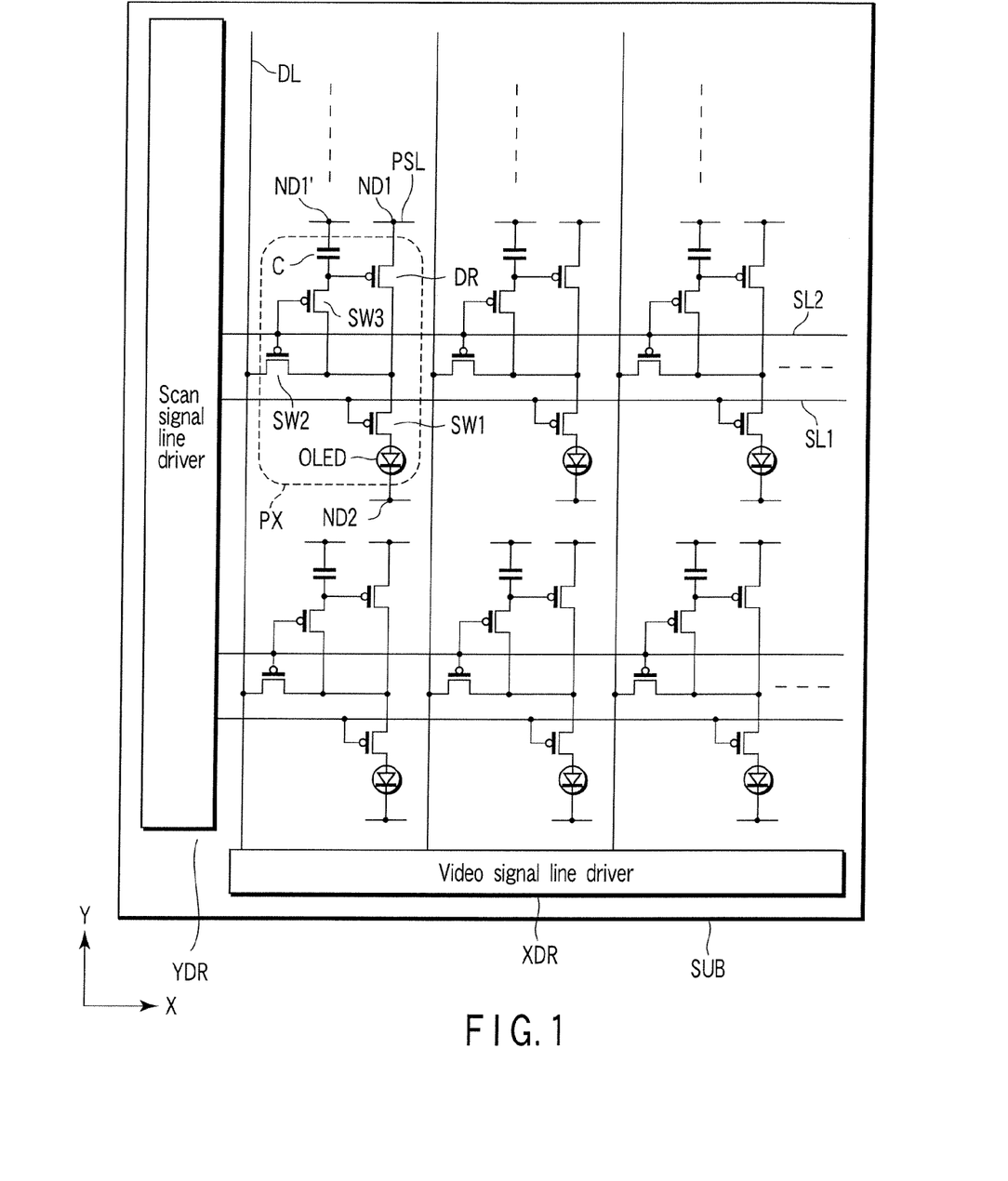
FIG. 1 is a plan view schematically showing a display according to an embodiment of the present invention.
Figure 2:
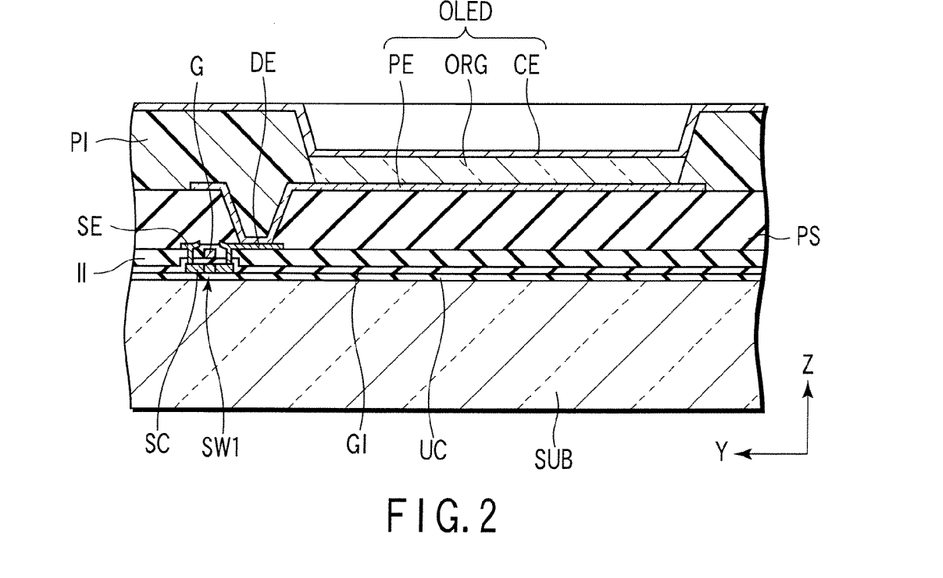
FIG. 2 is a sectional view schematically showing an example of a structure usable as the display shown in FIG. 1.
Figure 3:
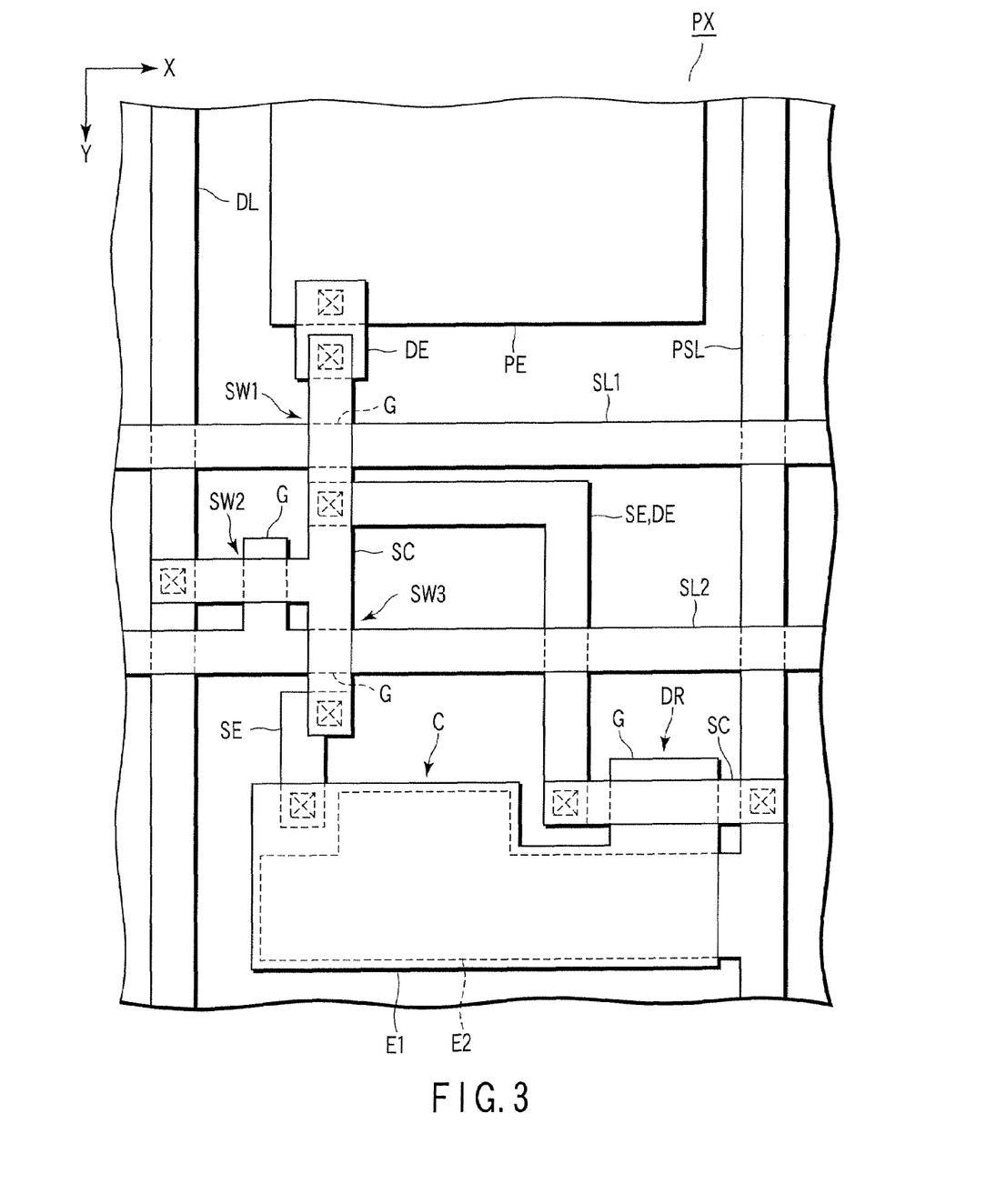
FIG. 3 is a plan view schematically showing an example of a structure usable as a pixel of the display shown in FIG. 1.

FIG. 1 is a plan view schematically showing a display according to an embodiment of the present invention. FIG. 2 is a sectional view schematically showing an example of a structure usable as the display shown in FIG. 1. FIG. 3 is a plan view schematically showing an example of a structure usable as a pixel of the display shown in FIG. 1. Note that in FIG. 2, the display is drawn such that the display surface, i.e., the front surface or light-emitting surface faces downwardly, and the back surface faces upwardly. Note also that FIG. 3 illustrates the structure of the pixel viewed from the display surface side.

This display is a bottom emission organic EL display using an active matrix driving method. The display includes an insulating substrate SUB such as a glass substrate.

On the substrate SUB, as shown in FIG. 2, an $SiN_x$ layer and $SiO_x$ layer, for example, are sequentially stacked as an undercoat layer UC.

On the undercoat layer UC, semiconductor layers SC such as polysilicon layers in each of which a channel, source and drain are formed, a gate insulator GI formed by using, e.g., tetraethyl orthosilicate (TEOS), and gates G made of, e.g., MoW are sequentially stacked to form top-gate type TFTs. In this embodiment, these TFTs are p-channel TFTs and used as a drive control element DR and switches SW1 to SW3 included in each pixel PX shown in FIGS. 1 to 3.

On the gate insulator GI, scan signal lines SL1 and SL2 shown in FIG. 1 and electrodes E1 shown in FIGS. 1 to 3 are further formed. The scan signal lines SL1 and SL2 and the electrodes E1 can be formed in the same step as the gates G.

As shown in FIG. 1, the scan signal lines SL1 and SL2 run in the row direction (X direction) of the pixels PX, and are alternately arranged in the column direction (Y direction) of the pixels PX. The scan signal lines SL1 and SL2 are connected to a scan signal line driver YDR.

The electrodes E1 are connected to the gates G of the drive control elements DR. Each electrode E1 is used as one electrode of a capacitor C (to be described later).

The gate insulator GI, gates G, scan signal lines SL1 and SL2, and electrodes E1 are covered with an interlayer dielectric film II shown in FIG. 2. The interlayer dielectric film II is made of, e.g., an $SiO_x$ film formed by plasma CVD. That portions of the interlayer dielectric film II which are positioned on the electrodes E1 are used as dielectric layers of the capacitors C.

On the interlayer dielectric film II, source electrodes SE and drain electrodes DE shown in FIGS. 2 and 3, video signal lines DL and power supply lines PSL shown in FIGS. 1 and 3, and electrodes E2 shown in FIG. 3 are arranged. These components can be formed in the same step, and have, e.g., a three-layered structure including Mo/Al/Mo.

The source electrodes SE and drain electrodes DE are electrically connected to the sources and drains, respectively, of the TFTs via contact holes formed in the interlayer dielectric film II.

As shown in FIGS. 1 and 3, the video signal lines DL run in the Y direction, and are arranged in the X direction. The video signal lines DL are connected to a video signal line driver XDR.

In this embodiment, as shown in FIG. 3, the power supply lines PSL run in the Y direction, and are arranged in the X direction.

The electrodes E2 are connected to the power supply lines PSL. Each electrode E2 is used as the other electrode of the capacitor C.

The source electrodes SE, drain electrodes DE, video signal lines DL, power supply lines PSL, and electrodes E2 are covered with a passivation film PS shown in FIG. 2. The passivation film PS is made of, e.g., $SiN_x$.

On the passivation film PS, as shown in FIG. 2, light-transmitting first electrodes PE as front electrodes are arranged away from each other. Each first electrode PE is a pixel electrode and, as shown in FIGS. 2 and 3, connected to the drain electrode DE of the switch SW1 via a through-hole formed in the passivation film PS.

In this embodiment, the first electrodes PE are anodes. As the material of the first electrodes PE, it is possible to use, e.g., a transparent conductive oxide such as indium tin oxide (ITO).

A partition insulating layer PI shown in FIG. 2 is further formed on the passivation film PS. In the partition insulating layer PI, through-holes are formed at positions corresponding to the first electrodes PE, or slits are formed at positions corresponding to the columns or rows formed by the first electrodes PE. In this embodiment, as an example, through-holes are formed at those positions of the partition insulating layer PI which correspond to the first electrodes PE.

The partition insulating layer PI is, e.g., an organic insulating layer. The partition insulating layer PI can be formed by using, e.g., photolithography.

On each first electrode PE, an organic layer ORG including an emission layer is formed. The emission layer is, e.g., a thin film containing a luminescent organic compound which emits red, green, or blue light. The organic layer ORG may further include a hole transporting layer, hole injection layer, hole blocking layer, electron transporting layer, and electron injection layer, in addition to the emission layer.

The partition insulating layer PI and organic layers ORG are covered with a second electrode CE as a back electrode. The second electrode CE is a common electrode connected between the pixels PX, and is a light-reflecting cathode in this embodiment. The second electrode CE is, e.g., electrically connected to electrode interconnections (not shown) formed on the layer on which the video signal lines DL are formed via contact holes formed in the passivation film PS and partition insulating layer PI. Each organic EL element OLED is made up of the first electrode PE, organic layer ORG, and second electrode CE.

Each pixel PX includes the organic EL element OLED and a pixel circuit. In this embodiment, as shown in FIGS. 1 and 3, the pixel circuit includes the drive control element DR, output control switch SW1, video signal supply control switch SW2, diode-connecting switch SW3, and capacitor C. In this embodiment as described above, the drive control element DR and the switches SW1 to SW3 are p-channel TFTs. Also, in this embodiment, the video signal supply control switch SW2 and diode-connecting switch SW3 form a switch group which switches the connection state of the drain of the drive control element DR, the video signal line DL, and the gate of the drive control element DR between a first state in which they are connected to one another and a second state in which they are disconnected from one another.

The drive control element DR, output control switch SW1, and organic EL element OLED are connected in series in this order between first and second power supply terminals ND1 and ND2. In this embodiment, the first power supply terminal ND1 is a high-potential power supply terminal, and the second power supply terminal ND2 is a low-potential power supply terminal.

The gate of the output control switch SW1 is connected to the scan signal line SL1. The video signal supply control switch SW2 is connected between the video signal line DL and the drain of the drive control element DR, and the gate of the video signal supply control switch SW2 is connected to the scan signal line SL2. The diode-connecting switch SW3 is connected between the drain and gate of the drive control element DR, and the gate of the diode-connecting switch SW3 is connected to the scan signal line SL2. The capacitor C is connected between the gate of the drive control element DR and a constant-potential terminal ND1'.

To display an image on this organic EL display, the scan signal lines SL1 and SL2, for example, are driven in a line-sequential manner. In a write period during which a video signal is to be written in a certain pixel PX, the scan signal line driver YDR first outputs a scan signal for opening the switch SW1 as a voltage signal to the scan signal line SL1 to which the pixel PX is connected, and outputs a scan signal for closing the switches SW2 and SW3 as a voltage signal to the scan signal line SL2 to which the pixel PX is connected. In this state, the video signal line driver XDR outputs a video signal as a current signal to the video signal line DL to which the pixel PX is connected, thereby setting the gate-to-source voltage of the drive control element DR at a magnitude corresponding to the video signal. After that, the scan signal line driver YDR outputs a scan signal for opening the switches SW2 and SW3 as a voltage signal to the scan signal line SL2 to which the pixel PX is connected, and outputs a scan signal for closing the switch SW1 as a voltage signal to the scan signal line SL1 to which the pixel PX is connected.

In an effective display period during which the switch SW1 is closed, a drive current with a magnitude corresponding to the gate-to-source voltage of the drive control element DR flows through the organic EL element OLED. The organic EL element OLED emits light at luminance corresponding to the magnitude of the drive current.

As described previously, a luminous dot with a luminous or dark line-like tail may form in an active matrix display in which a current signal is written as a video signal in a pixel circuit. The present inventor made a thorough examination on the reason of this phenomenon, and has found the following fact.

Assume, for example, that the source and drain of the drive control element DR shortcircuit in the pixel PX connected to the scan signal lines SL1 and SL2 on the Mth row and to the video signal line DL in the Nth column. In this case, the organic EL element OLED of the pixel PX always emits light at maximum luminance during the effective display period. Therefore, the pixel PX is viewed as a luminous dot.

Also, in this case, in the write period of the pixel PX, the video signal line driver XDR sets the video signal line DL in the Nth column at an electric potential substantially equal to that of the first power supply terminal ND1. That is, the electric potential of the video signal line DL in the Nth column rises excessively. Since the line capacitance of the video signal line DL is not negligibly small, write periods for, e.g., a few ten rows is necessary before the electric potential of the video signal line DL in the Nth row returns to an appropriate range.

Accordingly, of the pixels PX connected to the video signal line DL in the Nth column, signals smaller than the output from the video signal line driver XDR are written in a few ten pixels from the (M+1)th row. As a consequence, the luminance of each of these pixels PX becomes lower than the intended luminance. Therefore, these pixels PX are viewed as a dark line.

For the reason as described above, if the source and drain of the drive control element DR shortcircuit, a luminous dot with a dark line-like tail forms. Note that as is apparent from the above explanation, the luminance of the dark line is not constant, but normally rises from the end on the luminous dot side to the other end.

A luminous dot with a luminous line-like tail forms when, for example, the source and drain of the output control switch SW1 shortcircuit in the pixel PX connected to the scan signal lines SL1 and SL2 on the Mth row and to the video signal line DL in the Nth column.

That is, in this case, in the write period of the pixel PX, the video signal line driver XDR sets the video signal line DL in the Nth column at an electric potential lower than that of the second power supply terminal ND2. In the pixel PX, therefore, the gate potential of the drive control element DR falls extremely. Accordingly, the organic EL element OLED of the pixel PX always emits light at maximum luminance in the effective display period. As a consequence, the pixel PX is viewed as a luminous dot.

Also, in this case, in the write period of the pixel PX, the video signal line DL in the Nth column is set at an excessively low electric potential. Since the line capacitance of the video signal line DL is not negligibly small, a write period for, e.g., a few ten rows is necessary before the electric potential of the video signal line DL in the Nth row returns to an appropriate range.

Accordingly, of the pixels PX connected to the video signal line DL in the Nth column, signals larger than the output from the video signal line driver XDR are written in a few ten pixels from the (M+1)th row. As a consequence, the luminance of each of these pixels PX becomes higher than the intended luminance. Therefore, these pixels PX are viewed as a luminous line.

For the reason as described above, if the source and drain of the output control switch SW1 shortcircuit, a luminous dot with a luminous line-like tail forms. Note that as is evident from the above explanation, the luminance of the luminous line is not constant, but normally decreases from the end on the luminous dot side to the other end.

From the above fact, the present inventor has found that the appearance of a luminous dot with a luminous or dark line-like tail in an image can be prevented by the use of the following method.

That is, the structure shown in FIGS. 1 and 2 is formed first by the conventional method. Then, a repair process is performed.

In this repair process, a pixel which may be viewed as a luminous dot with a luminous or dark line-like tail is first selected from the pixels PX. Note that the pixel selected herein is a pixel PX corresponding to a luminous dot and is not a pixel PX corresponding to a luminous line or dark line. Note also that the luminous dot noted herein is exclusively a dot having a tail in the Y direction.

Then, in the selected pixel PX, both a first conductive path connecting the first electrode CE of the organic EL element OLED to the first power supply terminal ND1 and a second conductive path connecting the first conductive path to the video signal line DL are broken. The first conductive path is broken at, e.g., a portion which connects the output control switch SW1 and the first electrode PE of the organic EL element OLED. Also, the second conductive path is broken at, e.g., a portion which connects the video signal supply control switch SW2 and video signal line DL. Also, the first and second conductive paths are broken by irradiating the semiconductor layers SC of these paths with a laser beam.

When the first conductive path is broken in the selected pixel PX, the organic EL element OLED included in the pixel PX does not emit light in the effective display period. Therefore, the pixel PX is not viewed as a luminous dot.

Also, when the second conductive path is broken in the selected pixel PX, the electric potential of the video signal line DL to which the pixel PX is connected is not affected by the electric potential of the first or second power supply terminal ND1 or ND2 in the write period of the pixel PX. Accordingly, no luminous line or dark line is produced by the influence of the pixel PX.

When the repair described previously is performed, therefore, it is possible to prevent the appearance of a luminous dot with a luminous or dark line-like tail in an image.

This repair leaves traces explained below in the pixel PX. These traces will be described with reference to FIG. 4.

Figure 4:
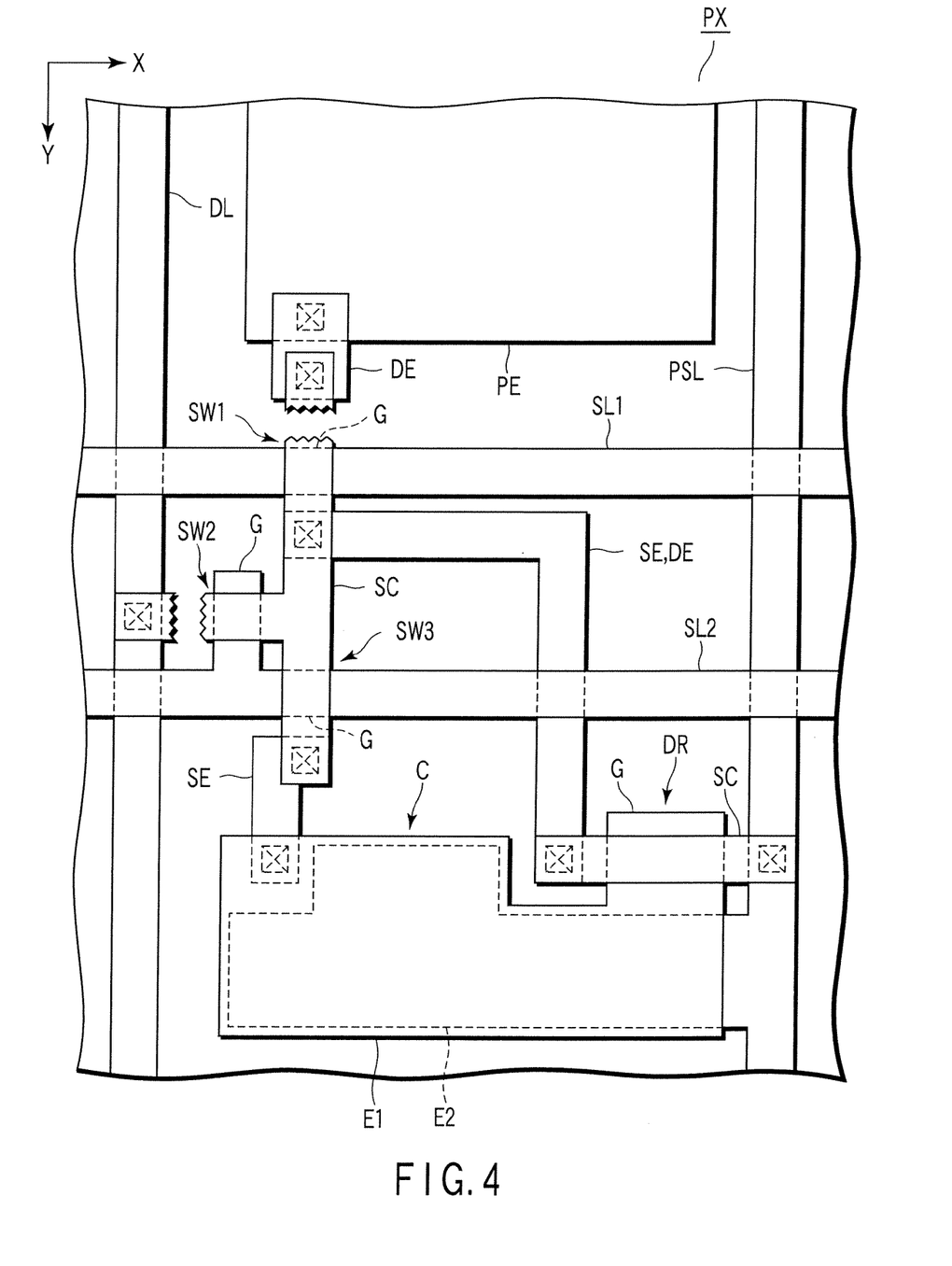
FIG. 4 is a plan view schematically showing a structure after the pixel shown in FIG. 3 is repaired.

FIG. 4 is a plan view schematically showing a structure after the pixel shown in FIG. 3 is repaired.

In this embodiment as described above, a pixel PX which may be viewed as a luminous dot with a luminous or dark line-like tail is selected, and both the first and second conductive paths are broken in the pixel PX. Therefore, in the completed organic EL display, some pixels PX include two broken portions.

For example, the structure shown in FIG. 4 is obtained when the first conductive path is broken at a portion which connects the output control switch SW1 and the first electrode PE of the organic EL element OLED, and the second conductive path is broken at a portion which connects the video signal supply control switch SW2 and video signal line DL. Note that when the semiconductor layer SC is crystalline like polysilicon and each path is to be broken at the position of the semiconductor layer SC, a phase change from crystalline to amorphous can be produced by irradiating the semiconductor layer SC with a laser beam. In this case, even if the semiconductor layer SC is physically incompletely broken by irradiation with the laser beam, its electric resistance rises significantly, so the electrical disconnection cannot be insufficient.

Although the organic EL display using the arrangement shown in FIG. 1 as the pixel PX is explained above, another arrangement may be used as the pixel PX. For example, it is possible to connect the video signal supply control switch SW2 and diode-connecting switch SW3 in series in this order between the video signal line DL and the drain of the drive control element DR, and connect the drain of the diode-connecting switch SW3 to the gate of the drive control element DR. Alternatively, the diode-connecting switch SW3 may be connected not between the drain and gate of the drive control element DR, but between the gate of the drive control element DR and the video signal line DL. Alternatively, the switch group may be made up of three or more switches, instead of the two switches, i.e., the video signal supply control switch SW2 and diode-connecting switch SW3.

Figure 5:
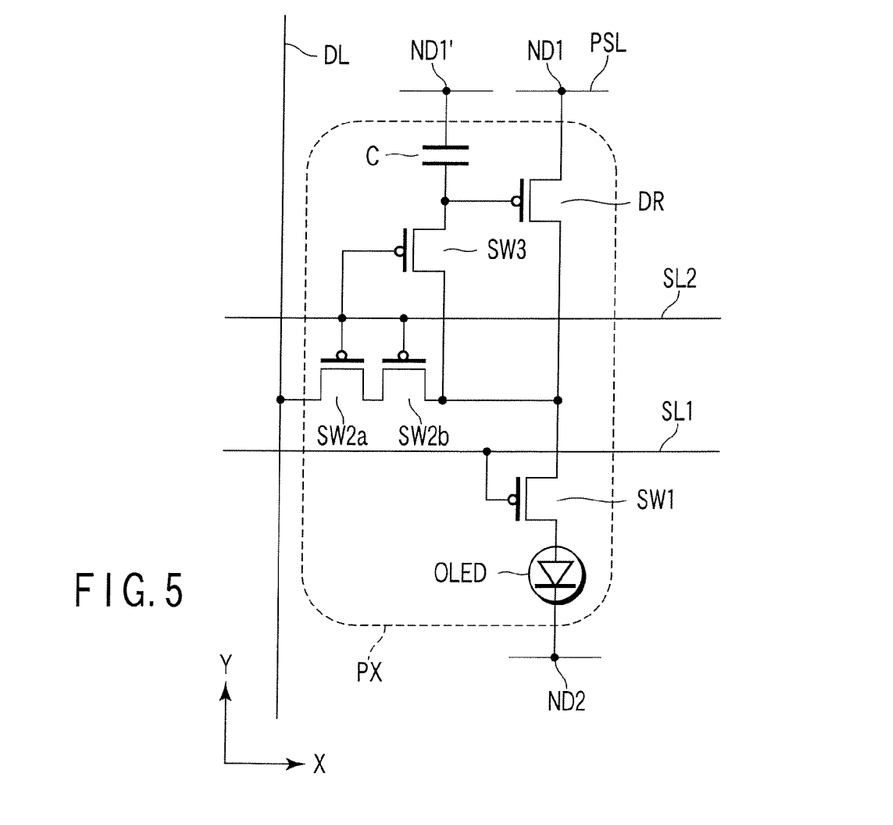
FIG. 5 is an equivalent circuit diagram of a pixel included in a display according to a modification.
Figure 6:
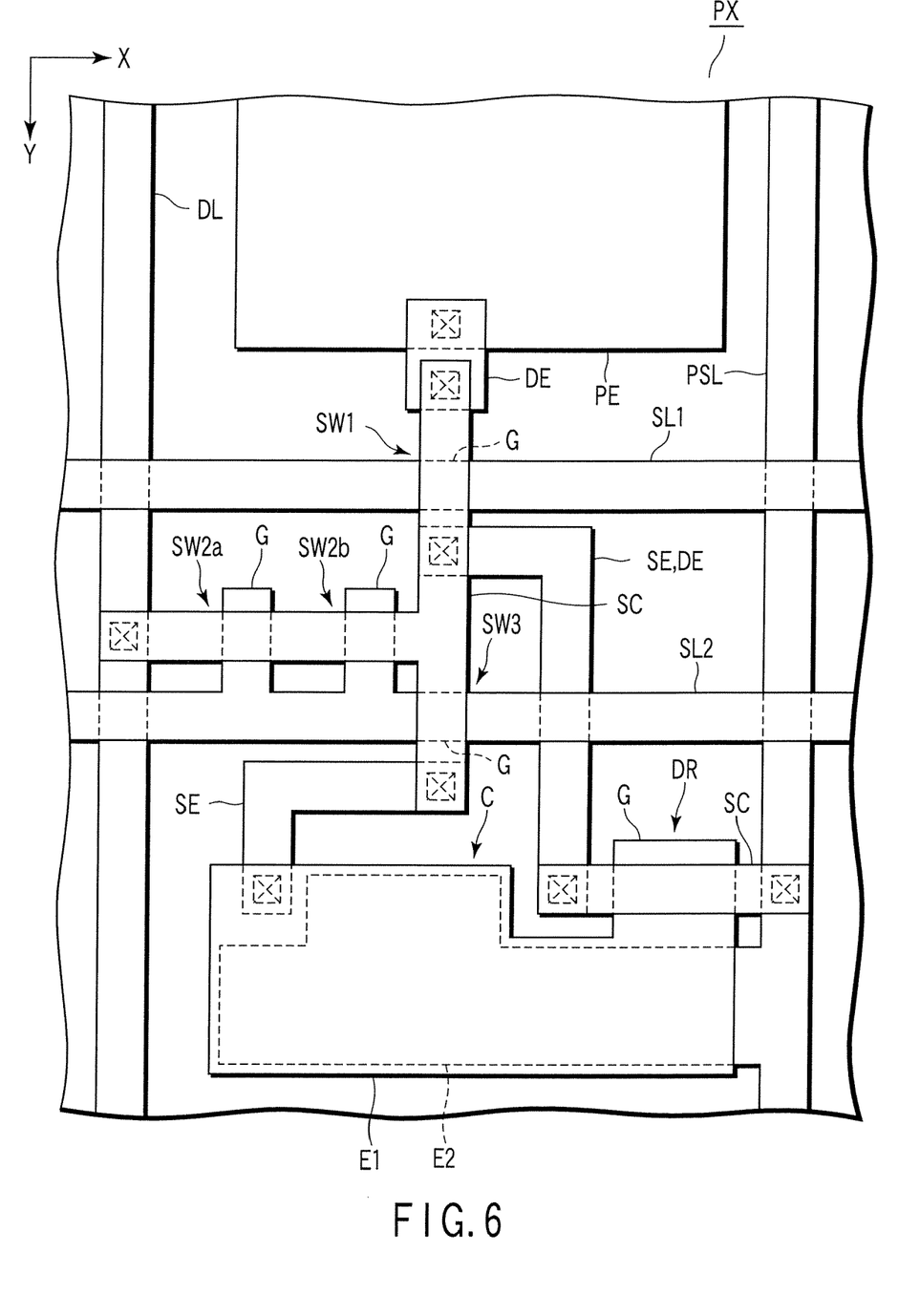
FIG. 6 is a plan view schematically showing an example of a structure usable as the pixel of the display according to the modification.

FIG. 5 is an equivalent circuit diagram of a pixel included in a display according to a modification. FIG. 6 is a plan view schematically showing an example of a structure usable as the pixel of the display according to the modification. Note that FIG. 6 illustrates the structure of the pixel viewed from the display surface side.

A pixel PX shown in FIGS. 5 and 6 has the same structure as the pixel PX shown in FIGS. 1 and 3 except that not a video signal supply control switch SW2 but video signal supply control switches SW2a and SW2b are connected in series in this order between a video signal line DL and the drain of a drive control element DR. That is, a switch group is made up of the video signal supply control switches SW2a and SW2b and a diode-connecting switch SW3, instead of the video signal supply control switch SW2 and diode-connecting switch SW3. In this way, the switch group may be made up of three or more switches.

When the structure shown in FIGS. 5 and 6 is used as the pixel PX, the repair described above may be performed in the following manner. This repair will be explained below with reference to FIGS. 7 and 8.

Figure 7:
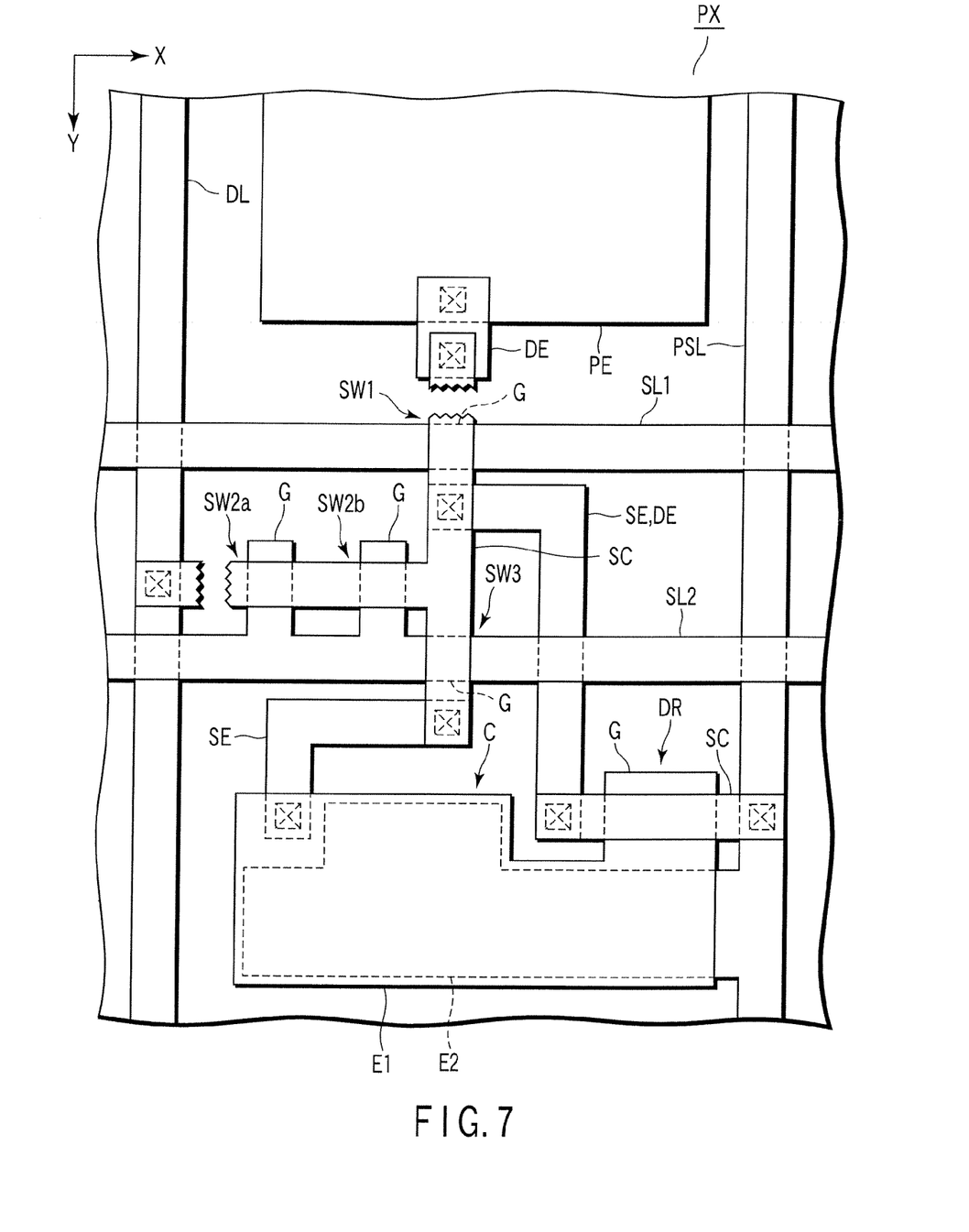
FIG. 7 is a plan view schematically showing an example of a structure after the pixel shown in FIG. 6 is repaired.
Figure 8:
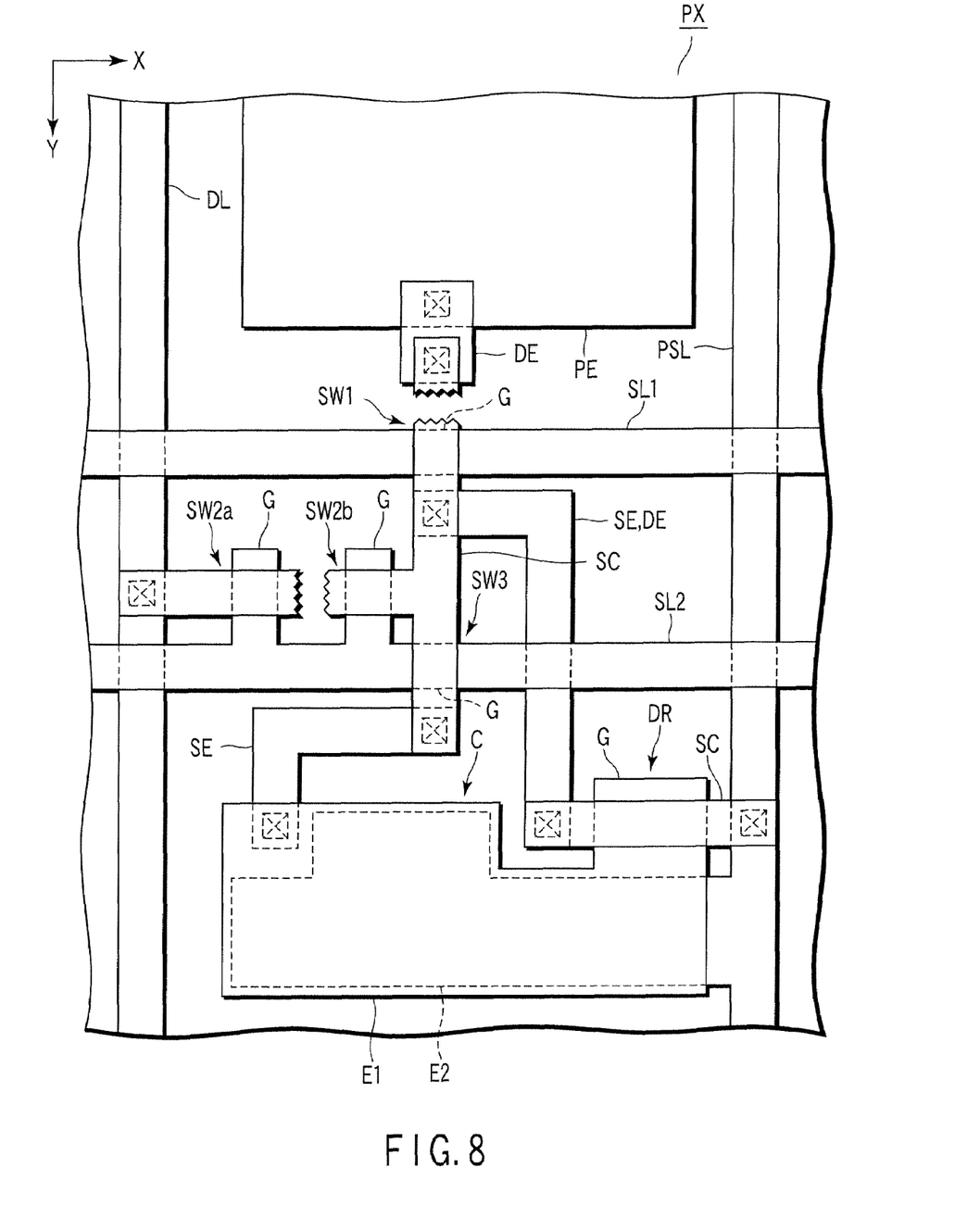
FIG. 8 is a plan view schematically showing another example of the structure after the pixel shown in FIG. 6 is repaired.

FIG. 7 is a plan view schematically showing an example of a structure after the pixel shown in FIG. 6 is repaired. FIG. 8 is a plan view schematically showing another example of the structure after the pixel shown in FIG. 6 is repaired.

Even when the structure shown in FIGS. 5 and 6 is used as the pixel PX, a pixel PX which may be viewed as a luminous dot with a luminous or dark line-like tail is selected in the same manner as above. Then, both first and second conductive paths are broken in the pixel PX.

The second conductive path can be broken at, e.g., a portion connecting the video signal supply control switch SW2a and video signal line DL. In this case, if the first conductive path is broken at a portion connecting an output control switch SW1 and a first electrode PE of an organic EL element OLED, the structure shown in FIG. 7 is obtained.

The second conductive path may be broken at a portion connecting the video signal supply control switches SW2a and SW2b. In this case, if the first conductive path is broken at the portion connecting the output control switch SW1 and the first electrode PE of the organic EL element OLED, the structure shown in FIG. 8 is obtained.

The organic EL display described above uses an arrangement in which the first and second conductive paths do not overlap any other interconnections or electrodes in their broken portions when viewed in a direction perpendicular to the main surface of a substrate SUB. This makes it possible to protect the other interconnections or electrodes from being damaged by laser beam irradiation for breaking the first and second conductive paths. Especially when the distance between the broken portions and the interconnections or electrodes other than the first and second conductive paths is about 2 μm or more when viewed in the direction perpendicular to the main surface of the substrate SUB, it is readily possible to protect the other interconnections or electrodes from being damaged by laser beam irradiation for breaking the first and second conductive paths.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a display comprising an insulating substrate, pixels arranged in a matrix form on the insulating substrate, and video signal lines arranged correspondingly with columns which the pixels form, wherein each of the pixels comprises a drive control element which includes a control terminal, a first terminal connected to a first power supply terminal, and a second terminal outputting a current with a magnitude corresponding to a voltage between the control terminal and the first terminal, a display element which includes a first electrode, a second electrode connected to a second power supply terminal, and an active layer interposed between the first and second electrodes, an output control switch which is connected between the second terminal and the first electrode, a switch group which switches an electrical connection between first and second states, the first state being a state that the second terminal, the video signal line, and the control terminal are electrically connected to one another, and the second state being a state that the second terminal, the video signal line, and the control terminal are electrically disconnected from one another, and a capacitor which is connected to the control terminal, comprising:

selecting at least one of the pixels which can be seen as a luminous line or a luminous dot with a dark line-like tail when an inspection image is displayed; and breaking a first conductive path electrically connecting the first electrode to the first power supply terminal and a second conductive path electrically connecting the second terminal to the video signal line in the selected pixel.

2. The method according to claim 1, wherein breaking the first and second conductive paths includes irradiating the first and second conductive paths with a laser beam.

3. The method according to claim 1, wherein the first and second conductive paths include first and second polysilicon portions, respectively, and wherein breaking the first and second conductive paths includes breaking the first and second polysilicon portions.

4. The method according to claim 3, wherein breaking the first and second conductive paths includes irradiating the first and second polysilicon portions with a laser beam.

5. The method according to claim 1, wherein the display element is an organic EL element.

* * * * *